United States Patent
Jin et al.

(10) Patent No.: US 11,005,067 B2
(45) Date of Patent: May 11, 2021

(54) OLED DISPLAY DEVICE

(71) Applicant: Wuhan China Star Optoelectronics Semiconductor Display Technology Co., Ltd., Wuhan (CN)

(72) Inventors: Jiangjiang Jin, Wuhan (CN); Hsianglun Hsu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 161 days.

(21) Appl. No.: 16/308,467

(22) PCT Filed: Aug. 23, 2018

(86) PCT No.: PCT/CN2018/101847
§ 371 (c)(1),
(2) Date: Dec. 9, 2018

(87) PCT Pub. No.: WO2020/019390
PCT Pub. Date: Jan. 30, 2020

(65) Prior Publication Data
US 2020/0067015 A1    Feb. 27, 2020

(30) Foreign Application Priority Data
Jul. 23, 2018 (CN) .......................... 201810811279.X

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 51/5237* (2013.01); *H01L 51/5246* (2013.01)

(58) Field of Classification Search
CPC ............. H01L 51/5246; H01L 27/3246; H01L 51/5253–5256; H01L 27/3283; H01L 27/3295; H01L 51/5237–525
See application file for complete search history.

(56) References Cited

U.S. PATENT DOCUMENTS

| | | | |
|---|---|---|---|
| 2009/0179566 A1 | 7/2009 | Imamura | |
| 2016/0240599 A1 | 8/2016 | Li et al. | |
| 2017/0077203 A1 | 3/2017 | Hsu | |
| 2018/0124933 A1* | 5/2018 | Park | H01L 51/5212 |

(Continued)

FOREIGN PATENT DOCUMENTS

| CN | 101257096 | 9/2008 |
|---|---|---|
| CN | 104037129 | 9/2014 |
| CN | 104538429 | 4/2015 |

(Continued)

*Primary Examiner* — Amar Movva

(57) ABSTRACT

The present invention provides an OLED display device, comprising: an OLED display panel, the OLED display panel comprising a display area and non-display areas in the both-ends edges of the display area; a dam unit and a film packaging layer. A part of the film packaging layer corresponding to the display area is disposed on the surface of the OLED display panel; another part of the film packaging layer corresponding to the non-display area is disposed on the surface of the dam unit; wherein, the dam unit comprises a flattening layer, a pixel isolation layer and a pixel support layer stacked-up together.

16 Claims, 1 Drawing Sheet

(56) References Cited

U.S. PATENT DOCUMENTS

2018/0233541 A1    8/2018   Zeng et al.

FOREIGN PATENT DOCUMENTS

| CN | 105590954 | 5/2016 |
| CN | 105914223 | 8/2016 |
| CN | 205789979 | 12/2016 |
| CN | 106784368 | 5/2017 |
| CN | 106873839 | 6/2017 |

* cited by examiner

OLED DISPLAY DEVICE

RELATED APPLICATIONS

This application is a National Phase of PCT Patent Application No. PCT/CN2018/101847 having International filing date of Aug. 23, 2018, which claims the benefit of priority of Chinese Patent Application No. 201810811279.X filed on Jul. 23, 2018. The contents of the above applications are all incorporated by reference as if fully set forth herein in their entirety.

FIELD AND BACKGROUND OF THE INVENTION

The present invention relates to display technology field, and more particularly to an OLED display device.

At present, the core illuminating element of OLED is electroluminescent device made of multi-layer organic small molecule/polymer, which is different from LCD/LED adopted with inorganic materials. As we know, organic materials are easy to be eroded by outside water and oxygen which brings about cracking and affects lifetime of OLED so the packaging technology plays an important role while the process and requirements of flexible OLED packaging are more complicated. At present, the flexible packaging structure is made of inorganic/organic alternative structure. The inorganic layer is mainly used to cut off water and oxygen while organic layer is used to buffer stress and fill some pinholes in inorganic layer to enhance the channel cutting off water and oxygen and function of covering particulate pollutant. The current OLED display device comprises a plurality of dam walls on the edge of organic packaging layer and inorganic packaging layer and the width of each dam wall is different. To some extent, the structure can avoid lateral erosion of outside water and oxygen but it may cause materials of organic packaging overflow due to machine error and difference between substrates etc. in organic coating process.

Based on the above, current OLED display device may cause materials of organic packaging overflow due to machine error and difference between substrates etc. in organic coating process and then further cause to lateral erosion of outside water and oxygen to OLED display device.

SUMMARY OF THE INVENTION

Current OLED display device may cause materials of organic packaging overflow due to machine error and difference between substrates etc. in organic coating process and then further cause to lateral erosion of outside water and oxygen to OLED display device.

The present invention provides an OLED display device, comprising: an OLED display panel, a dam unit of non-display area in the both-ends edges of the display area and a film packaging layer; the OLED display panel comprising a display area and non-display areas in the both-ends edges of the display area; a part of the film packaging layer corresponding to the display area being disposed on the surface of the OLED display panel; another part of the film packaging layer corresponding to the non-display area being disposed on the surface of the dam unit;

Wherein, the dam unit comprises a flattening layer, a pixel isolation layer and a pixel support layer stacked-up together. The width of the pixel support layer is 10-50 micrometers; the width of the pixel isolation layer is larger than that of the pixel support layer; the width of the flattening layer is larger than that of the pixel isolation layer.

In the OLED display device of the present invention, a part of the film packaging layer in the display area comprises a first inorganic packaging layer, an organic packaging layer and a second inorganic packaging layer stacked-up together.

In the OLED display device of the present invention, another part of the film packaging layer in the non-display area comprises the first inorganic packaging layer and the second inorganic layer; the first inorganic packaging layer and the second inorganic packaging layer cover the dam unit completely.

In the OLED display device of the present invention, the height of an edge of the organic packaging layer is lower than that of the flattening layer.

In the OLED display device of the present invention, the height of the edge of the organic packaging layer is higher than that of the flattening layer and lower than the sum height of the flattening layer and the pixel isolation layer.

In the OLED display device of the present invention, the height of the edge of the organic packaging layer is higher than the sum height of the flattening layer and the pixel isolation layer and lower than the sum height of the flattening layer, the pixel isolation layer and the pixel support layer.

In the OLED display device of the present invention, the materials of the first inorganic packaging layer are one or more combination of silicon nitride, silicon dioxide, aluminum oxide, titanium dioxide and zirconium dioxide; the thickness of the first inorganic packaging layer is 0.5-1.5 micrometers.

In the OLED display device of the present invention, the materials of organic packaging layer are acrylic, epikote or organosilicone; the thickness of the organic packaging layer is 4-20 micrometers.

In the OLED display device of the present invention, the material of the second inorganic packaging layer and the material of the first inorganic packaging layer are same; the thickness of the second inorganic packaging layer and the first inorganic packaging layer is the same.

An OLED display device comprises an OLED display panel, a dam unit of non-display area in the both-ends edges of the display area and a film packaging layer; the OLED display panel comprises a display area and non-display areas in the both-ends edges of the display area; a part of the film packaging layer corresponding to the display area is disposed on the surface of the OLED display panel; another part of the film packaging layer corresponding to the non-display area is disposed on the surface of the dam unit; wherein, the dam unit is provided with a flattening layer, a pixel isolation layer and a pixel support layer stacked-up together.

In the OLED display device of the present invention, the part of the film packaging layer in the display area comprises a first inorganic packaging layer, an organic packaging layer and a second inorganic packaging layer stacked-up together.

In the OLED display device of the present invention, the part of the film packaging layer in the non-display area comprises the first inorganic packaging layer and the second inorganic layer; the first inorganic packaging layer and the second inorganic packaging layer cover the dam unit completely.

In the OLED display device of the present invention, the height of an edge of the organic packaging layer is lower than that of the flattening layer.

In the OLED display device of the present invention, the height of the edge of the organic packaging layer is higher than that of the flattening layer and lower than the sum height of the flattening layer and the pixel isolation layer.

In the OLED display device of the present invention, the height of the edge of the organic packaging layer is higher than the sum height of the flattening layer and the pixel isolation layer and lower than the sum height of the flattening layer, the pixel isolation layer and the pixel support layer.

In the OLED display device of the present invention, the materials of the first inorganic packaging layer are one or more combination of silicon nitride, silicon dioxide, aluminum oxide, titanium dioxide and zirconium dioxide; the thickness of the first inorganic packaging layer is 0.5-1.5 micrometers.

In the OLED display device of the present invention, the materials of organic packaging layer are acrylic, epikote or organosilicone; the thickness of the organic packaging layer is 4-20 micrometers.

In the OLED display device of the present invention, the material of the second inorganic packaging layer and material of the first inorganic packaging layer are same; the thickness of the second inorganic packaging layer and the thickness of the first inorganic packaging layer are same.

The beneficial effect of the present invention is: The OLED display device uses the dam unit comprising the flattening layer, the pixel isolation layer and the pixel support layer stacked-up together to further prevent lateral erosion of outside water and oxygen to OLED display device so will be more beneficial to make the narrow-bezel display of OLED display device come true.

BRIEF DESCRIPTION OF THE SEVERAL VIEWS OF THE DRAWINGS

For more clearly understanding above content of the present invention, the following text will briefly introduce the accompanying drawings used in the preferred embodiment of the present invention. It is obvious that the accompanying drawings in the following description are only some embodiments of the present invention. For the technical personnel of the field, other drawings can also be obtained from these drawings without paying creative work.

DESCRIPTION OF THE SPECIFIC EMBODIMENTS OF THE INVENTION

The embodiments are shown in the accompanying drawings, in which the same or similar signs represent the same or similar elements or elements with the same or similar functions from beginning to end. The directions shown in the present invention, e.g. up, down, front, back, left, right, inside, outside, side face etc., are only illustrative directions of the accompanying drawings and are intended only to explain the present invention and are not understood as limitations to the invention. In the accompanying drawings, the units with similar structures are presented with same mark.

The present invention aims to solve the technical problem that current OLED display device may cause materials of organic packaging overflow due to machine error and difference between substrates etc. in organic coating process and then further cause to lateral erosion of outside water and oxygen to OLED display device.

The present invention provides an OLED display device, comprises:

an OLED display panel, the OLED display panel comprising a display area and non-display areas in the both-ends edges of the display area;

a dam unit, the dam unit in the non-display area of the both-ends edges of the display area;

a film packaging layer, a part of the film packaging layer corresponding to the display area being disposed on the surface of the OLED display panel; another part of the film packaging layer corresponding to the non-display area being disposed on the surface of the dam unit;

wherein, the dam unit is provided with a flattening layer, a pixel isolation layer and a pixel support layer stacked-up together.

Figure 1:
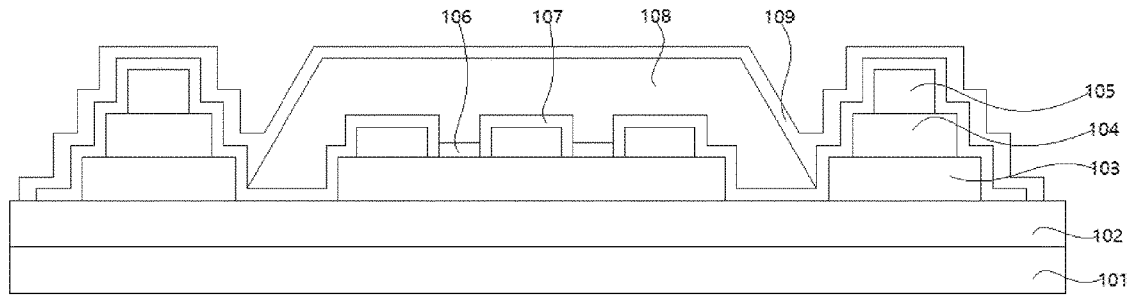
FIG. 1 is a cross-sectional view of Plan 1 for an OLED display device of the present invention.

FIG. 1 is a cross-sectional view of Plan 1 for an OLED display device of the present invention; the detailed production process is as follows.

First, providing a flexible substrate 101, the materials of the flexible substrate 101 can be polyvinyl alcohol, polyimide, polyester and so on. Make the TFT driver layer 102 on the surface of the flexible substrate 101. The main function of the TFT driver layer 102 is to supply electricity to drive OLED materials giving out light. Then depose the dam unit on the non-display area in the both-ends edges of the display area. The dam unit comprises a flattening layer 103, a pixel isolation layer 104 and a pixel support layer 105 stacked-up together; the width of the pixel support layer 105 is 10-50 micrometers, preferably is 20 micrometers; the width of the pixel isolation layer 104 is larger than that of the pixel support layer 105, preferably is 30 micrometers; the width of the flattening layer 103 is larger than that of the pixel isolation layer 104. The preferable width of the flattening layer 103 is 40 micrometers.

Second, dispose the luminous layer 106 in the display area of the OLED display device and dispose the film packaging layer on the surface of the OLED display device. A part of the film packaging layer corresponding to the display area is disposed on the surface of the OLED display panel. Another part of the film packaging layer corresponding to the non-display area is disposed on the surface of the dam unit. The part of the film packaging layer in the display area comprises the first inorganic packaging layer 107, the organic packaging layer 108, the second inorganic packaging layer 109 stacked-up together; the part of the film packaging layer in the non-display area comprises the first inorganic packaging layer 107 and the second inorganic layer 109; the first inorganic packaging layer 107 and the second inorganic packaging layer 109 cover the dam unit completely.

The materials of the first inorganic packaging layer 107 are one or more combination of silicon nitride, silicon dioxide, aluminum oxide, titanium dioxide and zirconium dioxide, preferably is silicon nitride; the thickness of the first inorganic packaging layer 107 is 0.5-1.5 micrometers, preferably is 1 micrometer.

The materials of organic packaging layer 108 are acrylic, epikote or organosilicone, preferably is epikote; the thickness of the organic packaging layer 108 is 4-20 micrometers, preferably is 10 micrometers; the height of edges of the organic packaging layer 108 is lower than or equal to that of the flattening layer 103.

The material of the second inorganic packaging layer 109 and the material of the first inorganic packaging layer 107 are same, preferably is silicon nitride; the thickness of the second inorganic packaging layer 109 and the thickness of the first inorganic packaging layer 107 are same, preferably is 1 micrometer.

The OLED display device with Plan 1 disposes the dam unit with the flattening layer, the pixel isolation layer and the pixel support layer stacked-up together and makes the height of both-ends edges of the organic packaging layer is lower than or equal to that of the flattening layer to further prevent lateral erosion of outside water and oxygen to OLED display device so will be more beneficial to make the narrow-bezel display of OLED display device come true.

Figure 2:
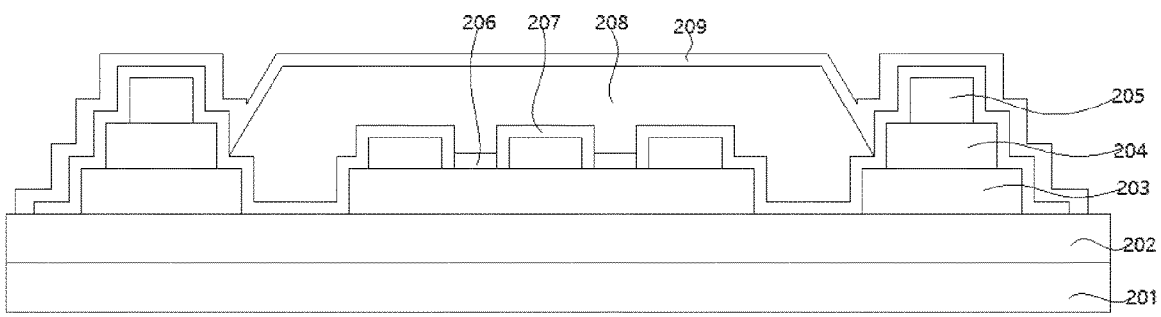
FIG. 2 is a cross-sectional view of Plan 2 for an OLED display device of the present invention.

FIG. 2 is a cross-sectional view of Plan 2 for an OLED display device of the present invention; the detailed production process is as follows.

First, providing a flexible substrate 201, the materials of the flexible substrate 201 can be polyvinyl alcohol, polyimide, polyester and so on. Make the TFT driver layer 202 on the surface of the flexible substrate 201. The main function of the TFT driver layer 202 is to supply electricity to drive OLED materials giving out light. Then depose the dam unit on the non-display area in the both-ends edges of the display area. The dam unit is provided with a flattening layer 203, a pixel isolation layer 204 and a pixel support layer 205 stacked-up together; the width of the pixel support layer 205 is 10-50 micrometers, preferably is 20 micrometers; the width of the pixel isolation layer 204 is larger than that of the pixel support layer 205, preferably is 30 micrometers; the width of the flattening layer 203 is larger than that of the pixel isolation layer 204. The preferable width of the flattening layer 203 is 40 micrometers.

Second, dispose the luminous layer 206 in the display area of the OLED display device and dispose the film packaging layer on the surface of the OLED display device. A part of the film packaging layer corresponding to the display area is disposed on the surface of the OLED display panel. Another part of the film packaging layer corresponding to the non-display area is disposed on the surface of the dam unit. The part of the film packaging layer in the display area is provided with the first inorganic packaging layer 207, the organic packaging layer 208 and the second inorganic packaging layer 209 stacked-up together; the part of the film packaging layer in the non-display area is provided with the first inorganic packaging layer 207 and the second inorganic layer 209; the first inorganic packaging layer 207 and the second inorganic packaging layer 209 cover the dam unit completely.

The materials of the first inorganic packaging layer 207 are one or more combination of silicon nitride, silicon dioxide, aluminum oxide, titanium dioxide and zirconium dioxide, preferably is silicon nitride; the thickness of the first inorganic packaging layer 207 is 0.5-1.5 micrometers, preferably is 1 micrometer.

The materials of organic packaging layer 208 are acrylic, epikote or organosilicone, preferably is epikote; the thickness of the organic packaging layer 208 is 4-20 micrometers, preferably is 10 micrometers; the height of edges of the organic packaging layer 208 is higher than that of the flattening layer 203 and lower than the sum height of the flattening layer 203 and the pixel isolation layer 204.

The material of the second inorganic packaging layer 209 and the material of the first inorganic packaging layer 207 is same, preferably is silicon nitride; the thickness of the second inorganic packaging layer 209 and the thickness the first inorganic packaging layer 207 is same, preferably is 1 micrometer.

The OLED display device with Plan 2 disposes the dam unit with flattening layer, pixel isolation layer and pixel support layer stacked-up together and makes the height of both-ends edges of the organic packaging layer is higher than that of the flattening layer and lower than the sum height of the flattening layer and the pixel isolation layer to further prevent lateral erosion of outside water and oxygen to OLED display device so will be more beneficial to make the narrow-bezel display of OLED display device come true.

Figure 3:
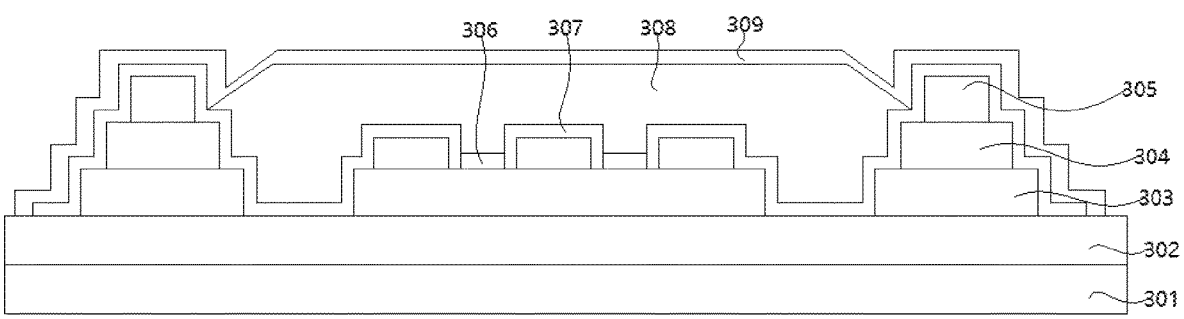
FIG. 3 is a cross-sectional view of Plan 3 for an OLED display device of the present invention.

FIG. 3 is a cross-sectional view of Plan 3 for an OLED display device of the present invention; the detailed production process is as follows.

First, providing a flexible substrate 301, the materials of the flexible substrate 301 can be polyvinyl alcohol, polyimide, polyester and so on. Make the TFT driver layer 302 on the surface of the flexible substrate 301. The main function of the TFT driver layer 302 is to supply electricity to drive OLED materials giving out light. Then depose the dam unit on the non-display area in the both-ends edges of the display area. The dam unit is provided with a flattening layer 303, a pixel isolation layer 304 and a pixel support layer 305 stacked-up together; the width of the pixel support layer 305 is 10-50 micrometers, preferably is 20 micrometers; the width of the pixel isolation layer 304 is larger than that of the pixel support layer 305, preferably is 30 micrometers; the width of the flattening layer 303 is larger than that of the pixel isolation layer 304. The preferable width of the flattening layer 303 is 40 micrometers.

Second, dispose the luminous layer 306 in the display area of the OLED display device and dispose the film packaging layer on the surface of the OLED display device. A part of the film packaging layer corresponding to the display area is disposed on the surface of the OLED display panel. Another part of the film packaging layer corresponding to the non-display area is disposed on the surface of the dam unit. The part of the film packaging layer in the display area comprises a first inorganic packaging layer 307, the organic packaging layer 308 and the second inorganic packaging layer 309 stacked-up together; the part of the film packaging layer in the non-display area comprises the first inorganic packaging layer 307 and the second inorganic layer 309; the first inorganic packaging layer 307 and the second inorganic packaging layer 309 cover the dam unit completely.

The materials of the first inorganic packaging layer 307 are one or more combination of silicon nitride, silicon dioxide, aluminum oxide, titanium dioxide and zirconium dioxide, preferably is silicon nitride; the thickness of the first inorganic packaging layer 307 is 0.5-1.5 micrometers, preferably is 1 micrometer.

The materials of organic packaging layer 308 are acrylic, epikote or organosilicon, preferably is epikote; the thickness of the organic packaging layer 308 is 4-20 micrometers, preferably is 10 micrometers; the height of edges of the organic packaging layer 308 is higher than the sum height of the flattening layer 303 and the pixel isolation layer 304 and lower than the sum height of the flattening layer 303, the pixel isolation layer 304 and the pixel support layer 305.

The material of the second inorganic packaging layer 309 and the material of the first inorganic packaging layer 307 are same, preferably is silicon nitride; the thickness of the second inorganic packaging layer 309 and the thickness of the first inorganic packaging layer 307 are same, preferably is 1 micrometer.

The OLED display device with Plan 3 disposes the dam unit with the flattening layer, the pixel isolation layer and the pixel support layer stacked-up together and makes the height of both-ends edges of the organic packaging layer is higher than the sum height of the flattening layer and the pixel isolation layer and lower than the sum height of the flattening layer, the pixel isolation layer and the pixel support layer to further prevent lateral erosion of outside water and oxygen to OLED display device so will be more beneficial to make the narrow-bezel display of OLED display device come true.

The beneficial effect of the present invention is: The OLED display device uses the dam unit consisting of the flattening layer, the pixel isolation layer and the pixel support layer to further prevent lateral erosion of outside water and oxygen to OLED display device so will be more beneficial to make the narrow-bezel display of OLED display device come true.

In above text, the principles and implementation mode of the present invention are expounded with specific examples but not to limit the invention. Moreover, for those of ordinary skill in the art, there will be changes in the specific implementation and application scope according to the ideas of the present invention. Therefore, the scope of protection for the invention shall be subject to the scope defined by the claims.

What is claimed is:

1. An organic light-emitting diode (OLED) display device, which comprises:
   an OLED display panel, comprising a display area and non-display areas in the both-ends edges of the display area;
   a dam unit, being disposed in non-display area in the both-ends edges of the display area;
   a film packaging layer, one part of the film packaging layer corresponding to the display area being disposed on the surface of the OLED display panel; another part of the film packaging layer corresponding to the non-display area being disposed on the surface of the dam unit, wherein the film packaging layer comprises a first inorganic packaging layer, an organic packaging layer and a second inorganic packaging layer stacked-up together; in a cross-section of the organic light-emitting diode (OLED) display device, the organic packaging layer comprises a sidewall closest to the dam unit, and the sidewall has a top edge spaced apart from the first inorganic packaging layer and a bottom edge in direct contact with the first inorganic packaging layer;
   wherein the dam unit comprises a flattening layer, a pixel isolation layer and a pixel support layer stacked-up together; the width of the pixel support layer is 10-50 micrometers, the width of the pixel isolation layer is larger than that of the pixel support layer, the width of the flattening layer is larger than that of the pixel isolation layer.

2. The OLED display device as claimed in claim 1, wherein the part of the film packaging layer in the non-display area comprises the first inorganic packaging layer and the second inorganic layer; the first inorganic packaging layer and the second inorganic packaging layer cover the dam unit completely.

3. The OLED display device as claimed in claim 1, wherein the height of an edge of the organic packaging layer is lower than that of the flattening layer.

4. The OLED display device as claimed in claim 1, wherein the height of an of the organic packaging layer is higher than that of the flattening layer and lower than the sum height of the flattening layer and the pixel isolation layer.

5. The OLED display device as claimed in claim 1, wherein the height of an of the organic packaging layer is higher than the sum height of the flattening layer and the pixel isolation layer and lower than the sum height of the flattening layer, the pixel isolation layer and the pixel support layer.

6. The OLED display device as claimed in claim 1, wherein the materials of the first inorganic packaging layer are one or more combination of silicon nitride, silicon dioxide, aluminum oxide, titanium dioxide and zirconium dioxide; the thickness of the first inorganic packaging layer is 0.5-1.5 micrometers.

7. The OLED display device as claimed in claim 1, wherein materials of organic packaging layer are acrylic, epikote or organosilicone; the thickness of the organic packaging layer is 4-20 micrometers.

8. The OLED display device as claimed in claim 1, wherein the material of the second inorganic packaging layer and the material of the first inorganic packaging layer are same; the thickness of the second inorganic packaging layer and the thickness of the first inorganic packaging layer are same.

9. An organic light-emitting diode (OLED) display device, wherein comprises:
   an OLED display panel, comprising a display area and non-display areas in the both-ends edges of the display area;
   a dam unit, being disposed in non-display area in the both-ends edges of the display area;
   a film packaging layer, one part of the film packaging layer corresponding to the display area being disposed on the surface of the OLED display panel; another part of the film packaging layer corresponding to the non-display area being disposed on the surface of the dam unit, wherein the film packaging layer comprises a first inorganic packaging layer, an organic packaging layer and a second inorganic packaging layer stacked-up together; in a cross-section of the organic light-emitting diode (OLED) display device, the organic packaging layer comprises a sidewall closest to the dam unit, and the sidewall has a top edge spaced apart from the first inorganic packaging layer and a bottom edge in direct contact with the first inorganic packaging layer;
   wherein the dam unit comprises a flattening layer, a pixel isolation layer and a pixel support layer stacked-up together.

10. The OLED display device as claimed in claim 9, wherein the part of the film packaging layer in the non-display area comprises the first inorganic packaging layer and the second inorganic layer; the first inorganic packaging layer and the second inorganic packaging layer cover the dam unit completely.

11. The OLED display device as claimed in claim 9, wherein the height of an edge of the organic packaging layer is lower than that of the flattening layer.

12. The OLED display device as claimed in claim 9, wherein the height of the organic packaging layer is higher than that of the flattening layer and lower than the sum height of the flattening layer and the pixel isolation layer.

13. The OLED display device as claimed in claim 9, wherein the height of an of the organic packaging layer is higher than the sum height of the flattening layer and the pixel isolation layer and lower than the sum height of the flattening layer, the pixel isolation layer and the pixel support layer.

14. The OLED display device as claimed in claim 9, wherein the materials of the first inorganic packaging layer are one or more combination of silicon nitride, silicon dioxide, aluminum oxide, titanium dioxide and zirconium dioxide; the thickness of the first inorganic packaging layer is 0.5-1.5 micrometers.

15. The OLED display device as claimed in claim 9, wherein the materials of organic packaging layer are acrylic, epikote or organosilicone; the thickness of the organic packaging layer is 4-20 micrometers.

16. The OLED display device as claimed in claim 9, wherein the material of the second inorganic packaging layer and the material of the first inorganic packaging layer are the same; the thickness of the second inorganic packaging layer and the thickness of the first inorganic packaging layer are same.

* * * * *